(12) United States Patent  
Ozard

(10) Patent No.: US 9,007,142 B1  
(45) Date of Patent: Apr. 14, 2015

(54) INTEGRATED OUTPUT COMBINER FOR AMPLIFIER SYSTEM

(75) Inventor: Kenneth Sean Ozard, Middlesex, NJ (US)

(73) Assignee: Anadigics, Inc., Warren, NJ (US)

( * ) Notice: Subject to any disclaimer, the term of this patent is extended or adjusted under 35 U.S.C. 154(b) by 265 days.

(21) Appl. No.: 13/548,774

(22) Filed: Jul. 13, 2012

Related U.S. Application Data

(60) Provisional application No. 61/514,380, filed on Aug. 2, 2011.

(51) Int. Cl.  
*H03H 7/38* (2006.01)  
*H03H 9/17* (2006.01)

(52) U.S. Cl.  
CPC ........................ *H03H 9/17* (2013.01)

(58) Field of Classification Search  
USPC ............... 333/124–129, 132; 330/124 R, 295  
See application file for complete search history.

(56) References Cited

U.S. PATENT DOCUMENTS

| | | | |
|---|---|---|---|
| 7,649,412 B2 * | 1/2010 | Horiguchi et al. | 330/124 R |
| 7,714,648 B2 * | 5/2010 | Okubo et al. | 330/124 R |
| 8,022,768 B1 | 9/2011 | Bowles et al. | |
| 8,237,506 B1 | 8/2012 | Bowles et al. | |
| 8,482,353 B2 * | 7/2013 | Blednov | 330/295 |
| 8,611,834 B2 * | 12/2013 | Harris et al. | 455/114.1 |
| 2011/0169590 A1 | 7/2011 | Namerikawa et al. | |

FOREIGN PATENT DOCUMENTS

WO    WO 2010003865 A1 *  1/2010

* cited by examiner

*Primary Examiner* — Robert Pascal  
*Assistant Examiner* — Kimberly Glenn  
(74) *Attorney, Agent, or Firm* — Ward & Zinna, LLC

(57) ABSTRACT

An output matching circuit for electronic amplifiers in the form of an integrated circuit is disclosed. The integrated circuit includes a first circuit, a second circuit, and a power sampling coupler. The first circuit is coupled to output of a first amplifier. The first circuit comprises a first matching section and an impedance inverter. The second circuit is coupled to output of a second amplifier, wherein the second circuit comprises a second matching section. The power sampling coupler is coupled to the first circuit and the second circuit, wherein the first circuit, the second circuit, and the power sampling coupler are fabricated as a single integrated circuit.

18 Claims, 13 Drawing Sheets

INTEGRATED OUTPUT COMBINER FOR AMPLIFIER SYSTEM

CROSS REFERENCE TO RELATED APPLICATION

This application claims priority from the U.S. provisional application No. 61/514,380 titled: "Improved Doherty Amplifier" filed on Aug. 2, 2011, the disclosure of which is hereby incorporated by reference.

TECHNICAL FIELD

The present invention generally relates to power amplifiers. More specifically, the present invention relates to an output matching network for the power amplifiers used in the field of communication devices.

BACKGROUND OF THE INVENTION

In recent times, various wireless communication systems use an amplifier system such as Doherty RF power amplifier in the base stations and mobile devices such as mobile phones due to their power efficiency. In many applications, it is highly desirable to reduce the cost, size and weight of the amplifier used in these communication systems. Doherty RF power amplifiers are increasingly being used due to their high-performance, reliability, and cost effectiveness. Doherty RF power amplifier systems amplify signals at high efficiency, with reduced distortion. A typical Doherty RF power amplifier system comprises a main amplifier and a peaking amplifier with an input of the main amplifier coupled to an input of the peaking amplifier by a quarter-wave transmission line. An output of the main amplifier is coupled to an output of the peaking amplifier by a second quarter-wave transmission line. A quarter-wave transmission line is coupled between the output of the peaking amplifier and a device output.

At low amplitude inputs, only the main amplifier is operational. At higher amplitude inputs, the peaking amplifier becomes operational and the quarter-wave delay in the input to the peaking amplifier matches the quarter-wave delay in the output of the main amplifier to the output of the peaking amplifier. Thus, the output of the peaking amplifier is in phase with the output of the main amplifier. In typical Doherty RF power amplifiers, the output matching network including the output matching, combining and output power sampling components constitute a notable portion of the cost, size and weight budgets of the amplifier system.

In view of the foregoing, an improved configuration of the output matching network is desired that results in substantial reduction of the size, weight and cost of the amplifier system.

SUMMARY OF THE INVENTION

According to embodiments illustrated herein, there is provided an output combiner circuit for electronic amplifiers. The output combiner circuit includes a first circuit, a second circuit, and a power sampling coupler. The first circuit is coupled to output of a first amplifier. The first circuit contains a first output matching section and an impedance inverter. The second circuit is coupled to output of a second amplifier, where the second circuit contains a second output matching section. The power sampling coupler is coupled to the first circuit and the second circuit. The first circuit, the second circuit, and the power sampling coupler are fabricated as a single integrated circuit. Thus in the present invention all components of the output combiner are provided in a single integrated circuit, in contrast to the prior art in which the components are separate, resulting in increased size, weight, and cost of the overall prior system. In an embodiment the integrated circuit may be a multi layered integrated circuit

BRIEF DESCRIPTION OF THE DRAWINGS

The detailed description of the embodiments of the invention will hereinafter be described in conjunction with the appended drawings provided to illustrate and not to limit the invention, wherein like designations denote like elements, and in which.

DESCRIPTION OF THE PREFERRED EMBODIMENTS

The invention can be best understood with reference to the detailed figures and description set forth herein. Various embodiments are discussed below with reference to the figures. However, those skilled in the art will readily appreciate that the detailed description given herein with respect to these figures is just for explanatory purposes. The disclosed systems extend beyond the described embodiments. For example, those skilled in the art will appreciate that in light of the teachings presented, multiple alternate and suitable approaches may be realized, to implement the functionality of any detail described herein, beyond the particular implementation choices in the following embodiments described and shown.

Figure 1:
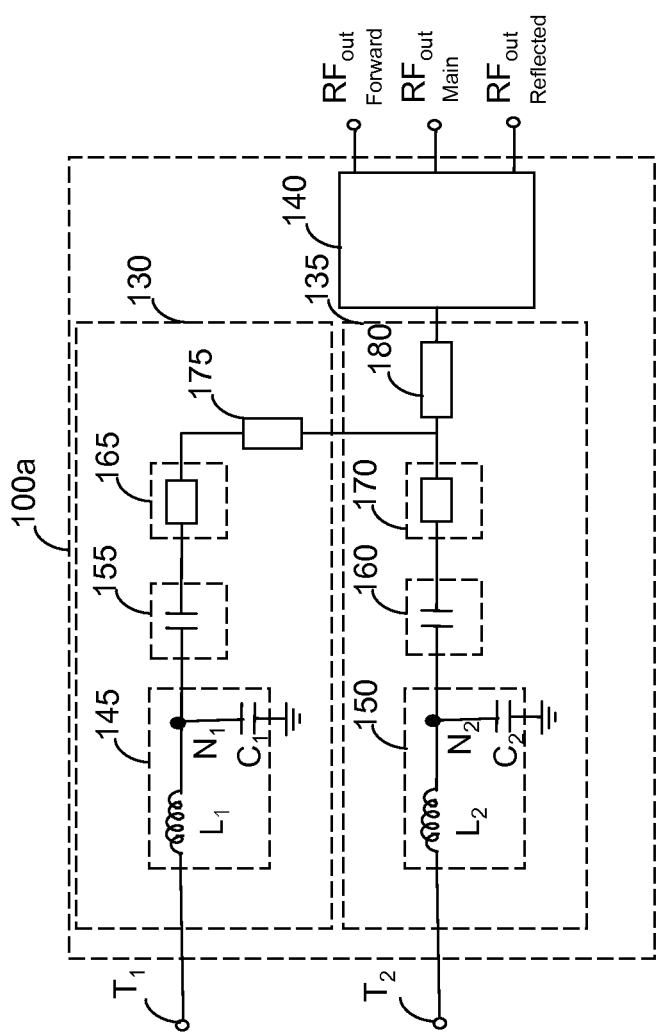
FIG. 1 illustrates an integrated circuit in accordance with an embodiment of the invention.

FIG. 1 illustrates an integrated circuit 100a (i.e., output combiner) in accordance with an embodiment of the invention. The integrated circuit 100a corresponds to an output combiner circuit for an amplifier system. The integrated circuit 100a includes a first circuit 130, a second circuit 135, and a power sampling coupler 140. The first circuit 130 includes a first output matching section 145, a first blocking capacitor 155, a first phase shifting component 165, and an impedance inverter 175. The second circuit 135 includes a second output matching section 150, a second blocking capacitor 160, a second phase shifting component 170, and an impedance transformer 180.

Figure 2:
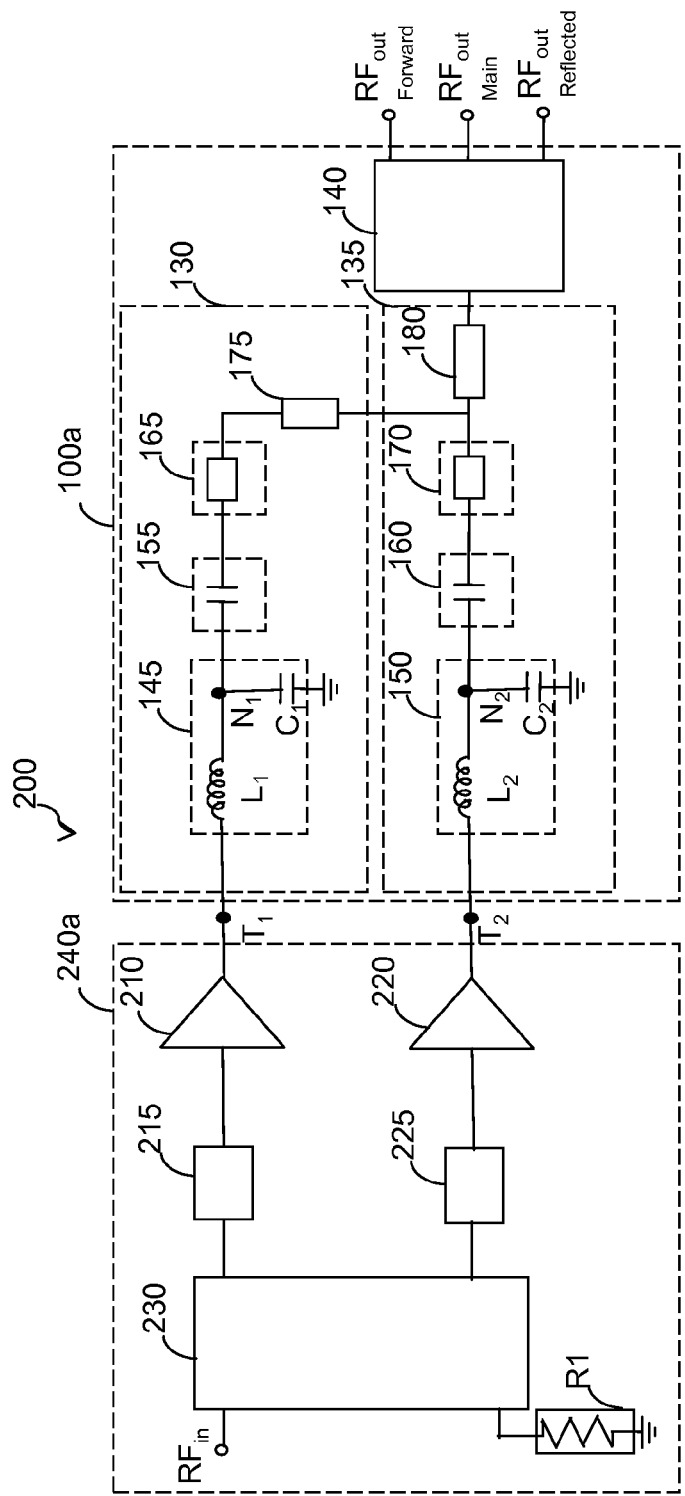
FIG. 2 illustrates a 2-way Doherty type power amplifier system in accordance with an embodiment of the invention.

The first output matching section 145 forms a filter having a first inductor $L_1$ and a first capacitor $C_1$. The first terminal of the first inductor $L_1$, the first terminal of the first capacitor $C_1$, and the first terminal of the first blocking capacitor 155 are coupled together at a node $N_1$. The second terminal of the first inductor $L_1$ is connected to an output terminal $T_1$ of a main amplifier 210 (as shown in FIG. 2). The second terminal of the first capacitor $C_1$ is grounded. The second terminal of the first blocking capacitor 155 is connected to the first phase shifting component 165. The output of the first phase shifting component 165 is coupled to a first end of the impedance inverter 175.

The second output matching section 150 forms a filter having a second inductor $L_2$ and a second capacitor $C_2$. The first terminal of the second inductor $L_2$, the first terminal of the second capacitor $C_2$, and the first terminal of the second blocking capacitor 160 are coupled together at a node $N_2$. The second terminal of the second inductor $L_2$ is connected to an output terminal $T_2$ of a first peaking amplifier 220 (as shown in FIG. 2). The second terminal of the second capacitor $C_2$ is grounded and the second terminal of the second blocking capacitor 160 is connected to the second phase shifting component 170. The output of the second phase shifting component 170 is coupled to a second end of the impedance inverter 175. The output of the impedance inverter 175 is coupled to an input of the impedance transformer 180.

Examples of the first output matching section 145 and the second output matching section 150 includes, but are not limited to, a low-pass filter, a multi-section filter, or a high-pass filter. Further, the first output matching section 145 and the second output matching section 150 includes various electronic components including, but are not limited to, capacitors, inductors, or strip lines.

The terminals $T_1$ and $T_2$ are the outputs of a first block 240a (as shown in FIG. 2) and the inputs of 100a. An output signal from the output terminal $T_1$ to the integrated circuit 100a first goes through the first output matching section 145. The signal then passes through the first blocking capacitor 155 which is used to block the DC component of the signal. Then, the signal is phase offset using the first phase shifting component 165. An output signal from the output terminal $T_2$ to the integrated circuit 100a first goes through the second output matching section 150. The signal then passes through the second blocking capacitor 160 which is used to block the DC component of the signal. Then the signal is phase offset using the second phase shifting component 170. The signals from the output terminals $T_1$ and $T_2$ are combined and then the combined signal passes through the impedance transformer 180. Finally, the output signal of the impedance transformer 180 goes through the power sampling coupler 140 and a output power would exit at a main RF output ($RF_{out\ Main}$), a reflected output sample ($RF_{out\ Reflected}$), and a forward output sample ($RF_{out\ Forward}$). Examples of the impedance inverter 175 and the impedance transformers 180 include, but are not limited to, a quarter-wave transformer. Examples of the power sampling coupler 140 include, but are not limited to, a bi-directional coupler or a dual-directional coupler.

Figure 5:
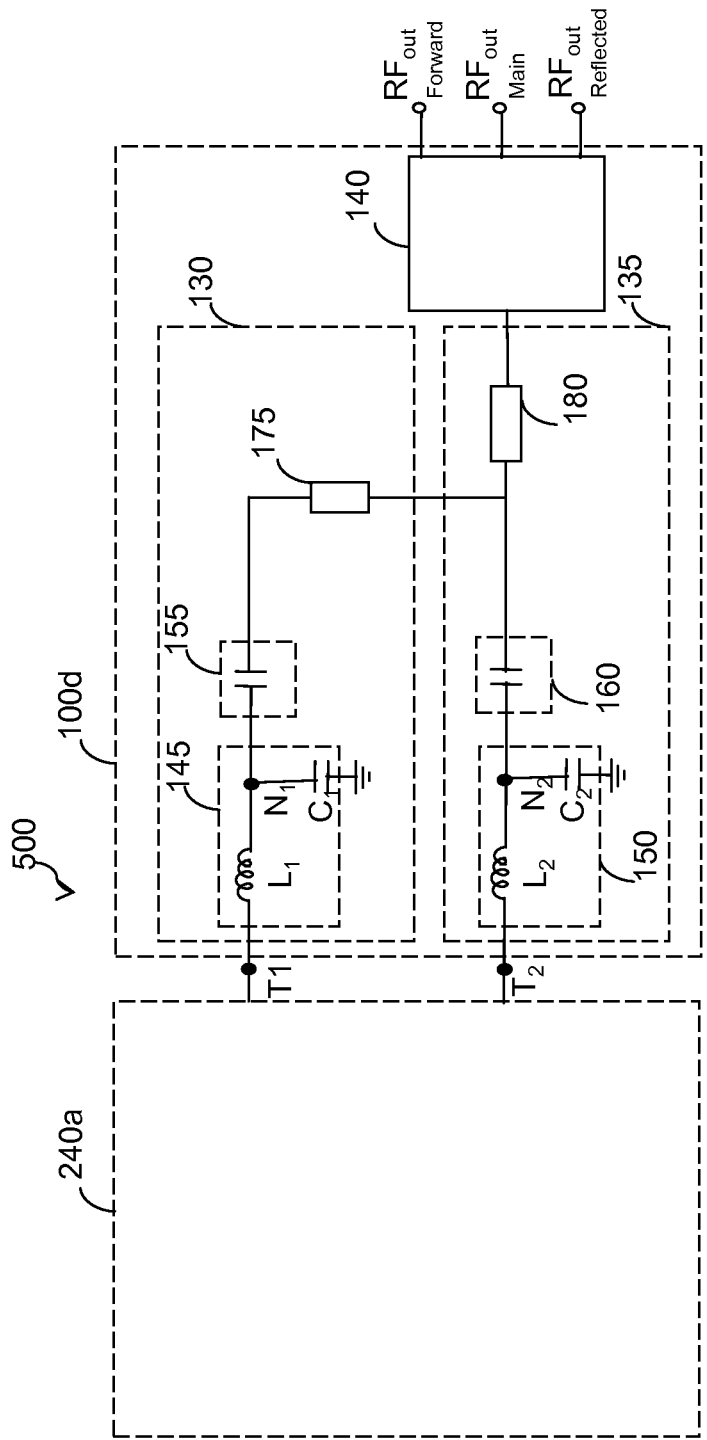
FIG. 5 illustrates a 2-way Doherty type power amplifier system in accordance with an embodiment of the invention.

In an embodiment, for example, the first and second phase shifting components (165,170) are optional and can be omitted (as shown in FIG. 5). Examples of the first and second phase shifting components (165,170) include, but are not limited to, a transmission line, a T section C-L-C or L-C-L, and the like.

Figure 6:
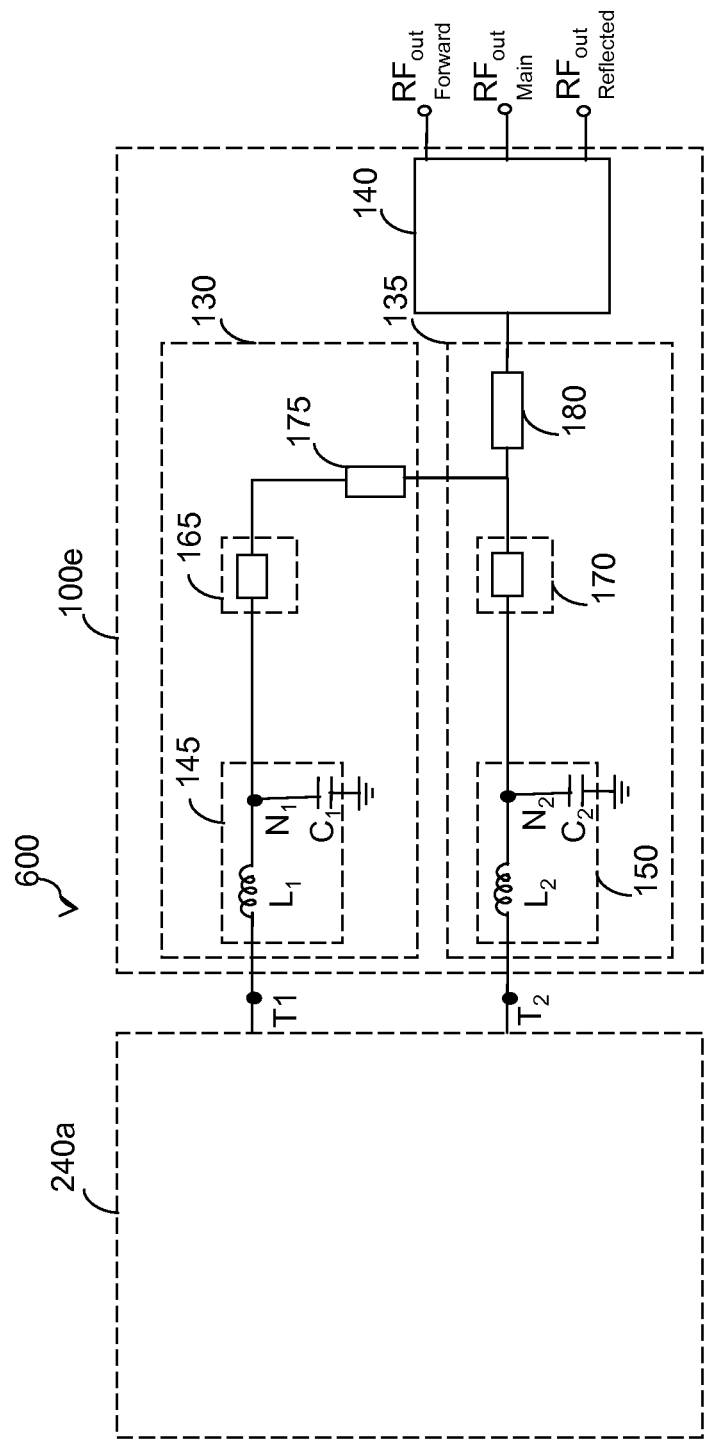
FIG. 6 illustrates a 2-way Doherty type power amplifier system in accordance with an embodiment of the invention.

In another embodiment, for example, the first blocking capacitor and the second blocking capacitors (155, 160) are optional and can be omitted (as shown in FIG. 6). In an embodiment, the integrated circuit 100a is fabricated as a multi-layer integrated circuit.

FIG. 2 illustrates a 2-way Doherty type power amplifier system 200 (hereinafter referred to as power amplifier system 200) in accordance with an embodiment of the invention. The power amplifier system 200 includes the first block 240a and the integrated circuit 100a. The first block 240a includes, an input power splitter 230, a first input matching section 215, a second input matching section 225, the main amplifier 210, and the first peaking amplifier 220.

The input power splitter 230 receives an input signal and the outputs of the input power splitter 230 are coupled to the inputs of the main amplifier 210 and the first peaking amplifier 220 through the first input matching section 215 and the second input matching section 225, respectively. The input power splitter 230 provides a 90 degree phase shift to one of the outputs. Any reflected signal at the input power splitter 230 is terminated through the resistor $R_1$. Examples of the input power splitter 230 include, but are not limited to, a 3-dB hybrid splitter or a 5-dB 90 degree hybrid splitter.

The first input matching section 215 is connected to the input of the main amplifier 210. In an embodiment, the first input matching section 215 includes an inductor and a capacitor. In another embodiment, the first input matching section 215 includes a single or multiple sections filters and/or stability resistors.

The second input matching section 225 is connected to the input of the first peaking amplifier 220. In an embodiment, the second input matching section 225 includes an inductor and a capacitor. In another embodiment, the first input matching section 215 includes a single or multiple sections filters and/or stability resistors.

The main amplifier 210 and the first peaking amplifier 220 can be made from a variety of different devices such as bipolar transistors, FET transistors, and vacuum tubes in special applications. The integrated circuit 100a receives the output signals of the first block 240a through the two output terminals $T_1$ and $T_2$. The integrated circuit 100a performs the functions as discussed above and the output power is obtained at a main RF output ($RF_{out\ Main}$), a reflected output sample ($RF_{out\ Reflected}$), and a forward output sample ($RF_{out\ Forward}$).

Figure 3:
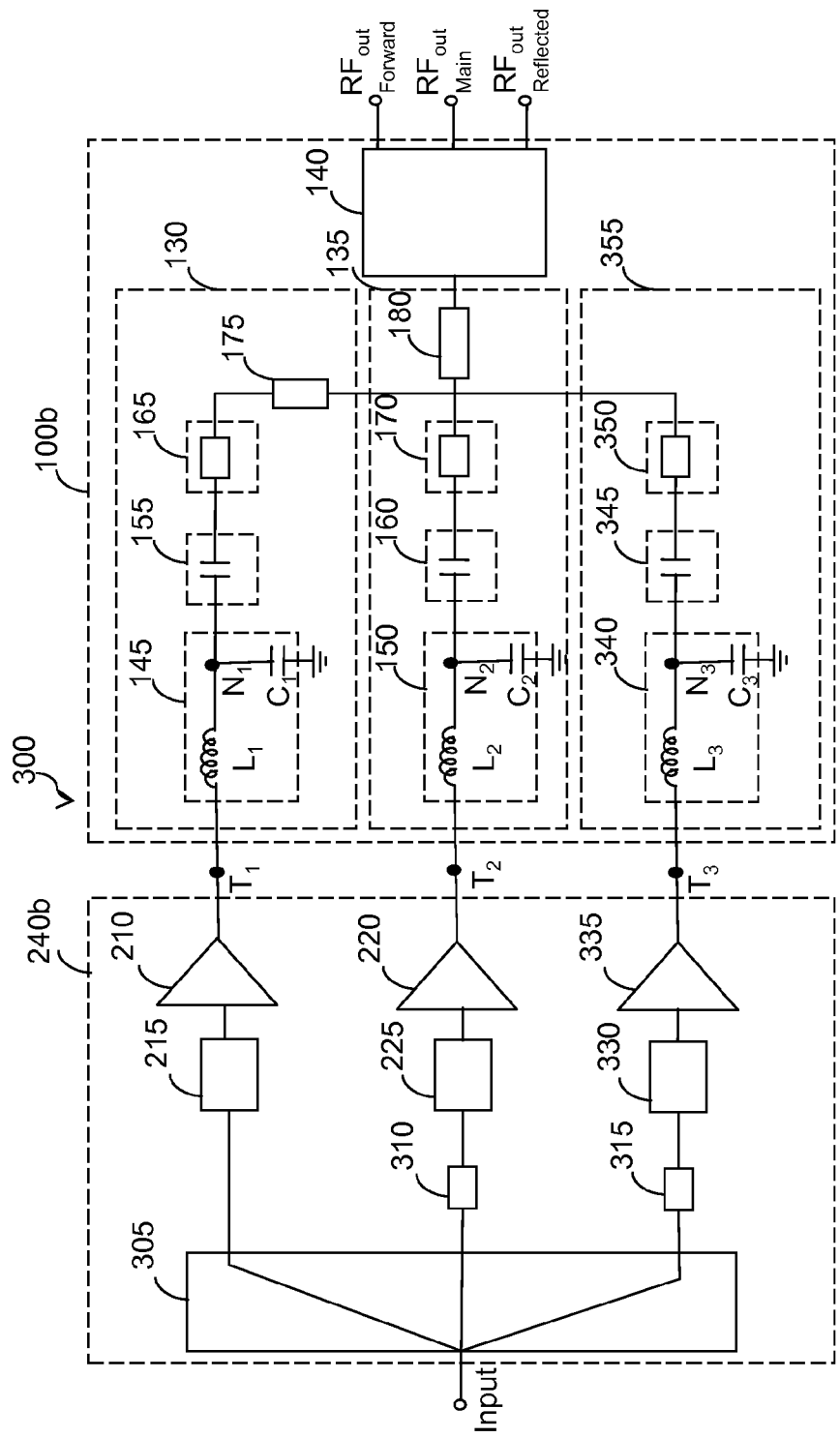
FIG. 3 illustrates a 3-way Doherty type power amplifier system in accordance with an embodiment of the invention.

FIG. 3 illustrates a 3-way Doherty type power amplifier system 300 (hereinafter referred to as power amplifier system 300) in accordance with an embodiment of the invention. The power amplifier system 300 includes a second block 240b and an integrated circuit 100b. The integrated circuit 100b corresponds to an output combiner circuit for an amplifier system. The second block 240b includes, an input power splitter 305, two phase shifters (310,315), three input matching sections (215, 225, and 330), the main amplifier 210, and first and second peaking amplifiers (220, 335).

The input power splitter 305 receives an input signal and provides three output signals. The input power splitter 305 provides various phase shifts in the output signals. Examples of the input power splitter 305 include, but are not limited to, 3-way equal power splitter. The first output signal goes to the input of the main amplifier 210 through the first input matching section 215. The second output signal is phase shifted by the phase shifter 310 and goes to the input of the first peaking amplifier 220 through the second input matching section 225.

The third output signal is phase shifted by the phase shifter 315 and goes to the input of the second peaking amplifier 335 through the third input matching section 330. Examples of third input matching section 330 includes, but are not limited to, a low-pass filter, a multi-section filter, or a high-pass filter. Further, third input matching section 330 includes various electronic components including, but are not limited to, capacitors, inductors, stability resistors, or strip lines.

The output terminals ($T_1$, $T_2$, and $T_3$) of each of the amplifiers (210, 220, and 335) are connected to corresponding inputs of the integrated circuit 100b as depicted in the FIG. 3.

The integrated circuit 100b, in addition to the first circuit 130 and the second circuit 135, includes a third circuit 355 corresponding to the second peaking amplifier 335. The third circuit 355 includes a third output matching section 340, a third blocking capacitor 345, and a third phase shifting component 350. The output of the third phase shifting component 350 is coupled to the output of the impedance inverter 175. Examples of the third phase shifting component 350 include, but are not limited to, a transmission line, a T section C-L-C or L-C-L, and the like.

The third output matching section 340 receives the signal from the terminal $T_3$. The third output matching section 340 includes a third inductor $L_3$ and a third capacitor $C_3$ forming a filter. The output from the first phase shifting component 165 of the first circuit 130 then goes through the impedance inverter 175. The output of the second phase shifting component 170, the output of the third phase shifting component 350, and the output signal of the impedance inverter 175 are then fed to the impedance transformer 180. Finally, the output signal of the impedance transformer 180 goes through the power sampling coupler 140 and the output power can be obtained at a main RF output ($RF_{out\ Main}$), a reflected output sample ($RF_{out\ Reflected}$), and a forward output sample ($RF_{out\ Forward}$). In an embodiment, the integrated circuit 100b is fabricated as a multi-layer integrated circuit.

There are other wide ranges of implementations possible of the integrated circuit 100b for the second block 240b as would be apparent to a person having ordinary skill in the art. For example, there are differing configurations and connections of the phase shifters (310, 315), the phase shifting components (165, 170, 350), and the impedance inverter 175 lines offering various performance advantages.

Figure 4:
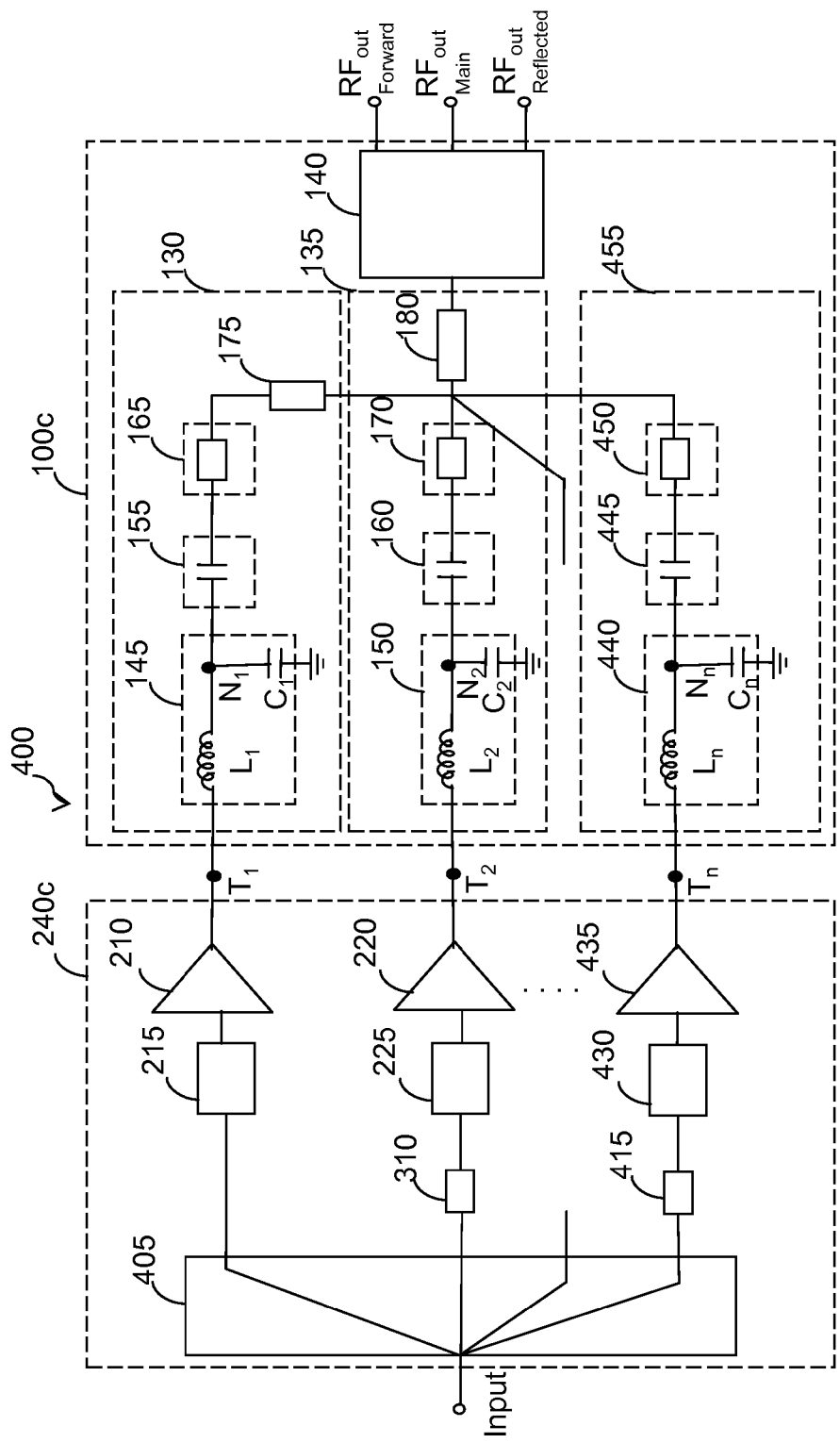
FIG. 4 illustrates an N-way Doherty type power amplifier system in accordance with an embodiment of the invention.

FIG. 4 illustrates an N-way Doherty type power amplifier system 400 (hereinafter referred to as power amplifier system 400) in accordance with an embodiment of the invention. The power amplifier system 400 includes a third block 240c and an integrated circuit 100c. The integrated circuit 100c corresponds to an output combiner circuit for an amplifier system. The third block 240c includes an input power splitter 405, two phase shifters (410, 415), three input matching sections (215, 225, . . . , 430), the main amplifier 210, and N–1 peaking amplifiers (220, . . . , 435).

The input power splitter 405 receives an input signal and provides N output signals. The input power splitter 405 provides various phase shifts and provides the output signals. Examples of the input power splitter 405 include, but are not limited to, N-way equal power splitter. The first output signal goes to the input of the main amplifier 210 through the first input matching section 215. The second output signal is phase shifted by the phase shifter 310 and goes to the input of the first peaking amplifier 220 through the second input matching section 225. The third to the $N^{th}$ output signals are phase shifted by respective phase shifters (not shown, except the $N^{th}$ phase shifter 415) and goes to the inputs of the second (not shown in FIG. 4) to the $(N-1)^{th}$ peaking amplifier 435 through the third input matching section (not shown) to the $N^{th}$ input matching section 430, respectively.

Examples of the $N^{th}$ input matching section 430 includes, but are not limited to, a low-pass filter, a multi-section filter, or a high-pass filter. Further, $N^{th}$ input matching section 430 includes various electronic components including, but are not limited to, capacitors, inductors, stability resistors, or strip lines.

The output terminals ($T_1$, $T_2$, . . . , $T_n$) of each of the amplifiers (210, 220, and 435) are connected to corresponding inputs of the integrated circuit 100b as depicted in the FIG. 4.

The integrated circuit 100c, in addition to the first circuit 130 and the second circuit 135, includes a third circuit (not shown) to an $N^{th}$ circuit 455 corresponding to the $(N-1)^{th}$ peaking amplifier 435. Thus, the integrated circuit 100c includes N circuits (such as 130, 135, . . . , 455). The $N^{th}$ circuit 455 includes an $N^{th}$ output matching section 440, an $N^{th}$ blocking capacitor 445 and an $N^{th}$ phase shifting component 450. The output of the $N^{th}$ phase shifting component 450 is coupled to the output of the impedance inverter 175. Examples of the $N^{th}$ phase shifting component 450 include, but are not limited to, a transmission line, a T section C-L-C or L-C-L, and the like.

The $N^{th}$ output matching section 440 receives the signal from the terminal $T_n$. The $N^{th}$ output matching section 440 includes an $n^{th}$ inductor $L_n$ and an $n^{th}$ capacitor $C_n$ forming a filter. The output from the first phase shifting component 165 then goes through the impedance inverter 175. The output of the second phase shifting component 170, outputs of a third phase shifting component (e.g., part of the third circuit—not shown) to the $N^{th}$ phase shifting component 450, and the output signal from the impedance inverter 175 are then fed to the impedance transformer 180. Finally, the output signal of the impedance transformer 180 goes through the power sampling coupler 140 and the output power would exit at a main RF output ($RF_{out\ Main}$), a reflected output sample ($RF_{out\ Reflected}$), and a forward output sample ($RF_{out}$ Forward). In an embodiment, the integrated circuit 100b is fabricated as a multi-layer integrated circuit.

There are other wide ranges of implementations possible of the integrated circuit 100c for the third block 240c as would be apparent to a person having ordinary skill in the art. For example, there are differing configurations and connections of the phase shifters (410, 415), the first, second, and $N^{th}$ phase shifting components (165, 170, 450), and the impedance inverter 175 lines offering various performance advantages.

The phase shifters (310, 315, 410, and 415) as shown in FIG. 3 and FIG. 4 phase shift the input signal from the input power splitters (305, 405). This will introduce a phase delay into the inputs going to the peaking amplifiers. Further, certain peaking amplifier bias conditions (such as Class C power amplifier) of the peaking amplifiers (220, 335, and 445) and input power split ratios of the input power splitters (230, 305, and 405) enables only the main amplifier to be operational at low amplitudes. Examples of the phase shifters (310, 315, 410, and 415) include, but are not limited to, a +90° phase shifter, a −90° phase shifter, and the like. The phase shifters (310, 315, 410, and 415) may include various electronic components including, but not limited to, transmission line, a T section C-L-C or L-C-L, and the like.

FIG. 5 illustrates a 2-way Doherty type power amplifier system 500 (hereinafter referred to as power amplifier system 500) in accordance with an embodiment. The power amplifier system 500 includes the first block 240a and an integrated circuit 100d. The integrated circuit 100d corresponds to an output combiner circuit for an amplifier system. The integrated circuit 100d doesn't feature the first and second phase shifting components (165,170). In an embodiment, the impedance inverter 175 provides a 90 degree phase shift to an output of the first blocking capacitor 155. At this stage, the output of the first blocking capacitor and the output of the second blocking capacitor are in phase. Further, the output of the impedance inverter 175 is then combined with the output signal from the second blocking capacitor 160 and the combined output signal then goes to the input of the impedance transformer 180. Thus in the 2-way Doherty type power amplifier systems the normal functionality can also be achieved without the first and second phase shifting components (165,170).

In an embodiment, the integrated circuit 100d is fabricated as a multi-layer integrated circuit.

FIG. 6 illustrates a 2-way Doherty type power amplifier system 600 (hereinafter referred to as power amplifier system 600) in accordance with an embodiment. The power amplifier system 600 includes the first block 240a and an integrated circuit 100e. The integrated circuit 100e corresponds to an output combiner circuit for an amplifier system. The integrated circuit 100e doesn't feature the first and the second blocking capacitors (155,160). It will be apparent to a person having ordinary skill in the art that the first and second blocking capacitors (155,160) may be removed or may be outside of the integrated circuit 100e depending on a variety of factors such as frequencies or the properties of construction materials/dielectric which make the first and second blocking capacitors (155,160) too large to integrate.

It is apparent to a person having ordinary skill in the art that certain matching configurations in the power amplifier system 600 will eliminate the need for the first and second blocking capacitors (155,160). In an embodiment, the integrated circuit 100e is fabricated as a multi-layer integrated circuit.

Figure 7:
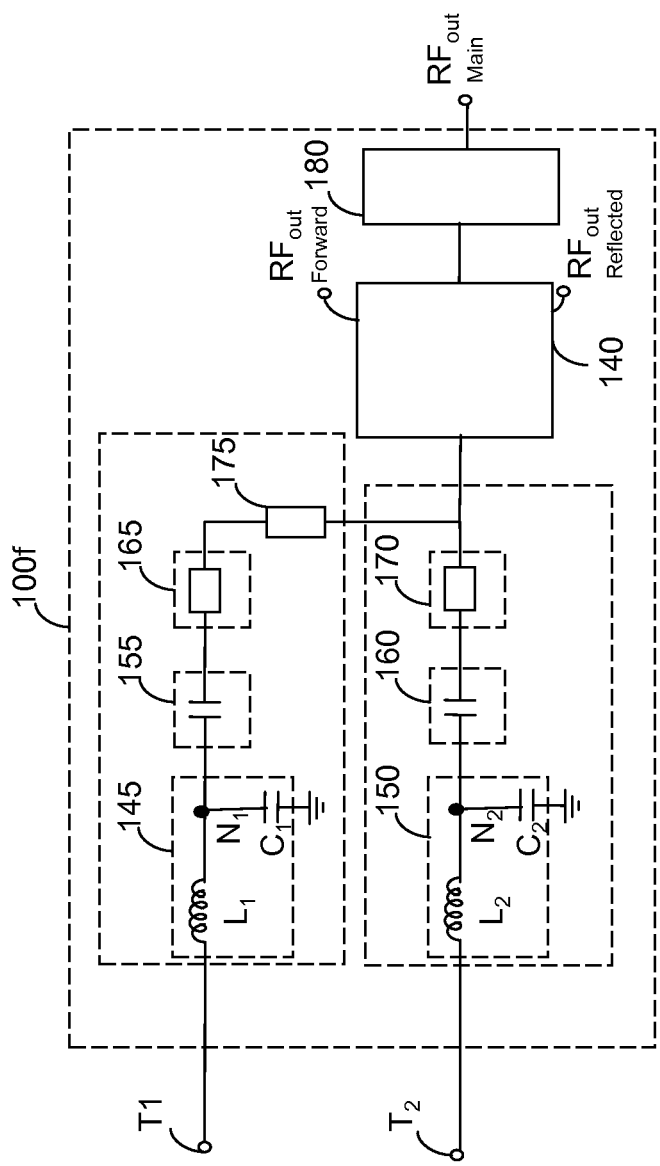
FIG. 7 illustrates an integrated circuit in accordance with an embodiment of the invention.

FIG. 7 illustrates an integrated circuit 100f (i.e., output combiner) in accordance with an embodiment of the invention. The integrated circuit 100f corresponds to an output combiner circuit for an amplifier system.

The output terminal $T_1$ of the main amplifier 210 and the output terminal $T_2$ of the peaking amplifier 220 are connected to the inputs of the integrated circuit 100f. The output signal from the terminal $T_1$, pass through the first output matching section 145, the first blocking capacitor 155, and the first phase shifting component 165 of the first circuit 130. The signal from the terminal $T_2$, pass through the second output matching section 150, the second blocking capacitor 160, and the second phase shifting component 170 of the second circuit 135. The output of the first phase shifting component 165 is received at the input of the impedance inverter 175. FIG. 7 depicts an integrated circuit 100f where a power sampling coupler 140 is placed before an impedance transformer 180. In an embodiment, the integrated circuit 100f is fabricated as a multi-layer integrated circuit as is discussed in detail below.

Figure 8:
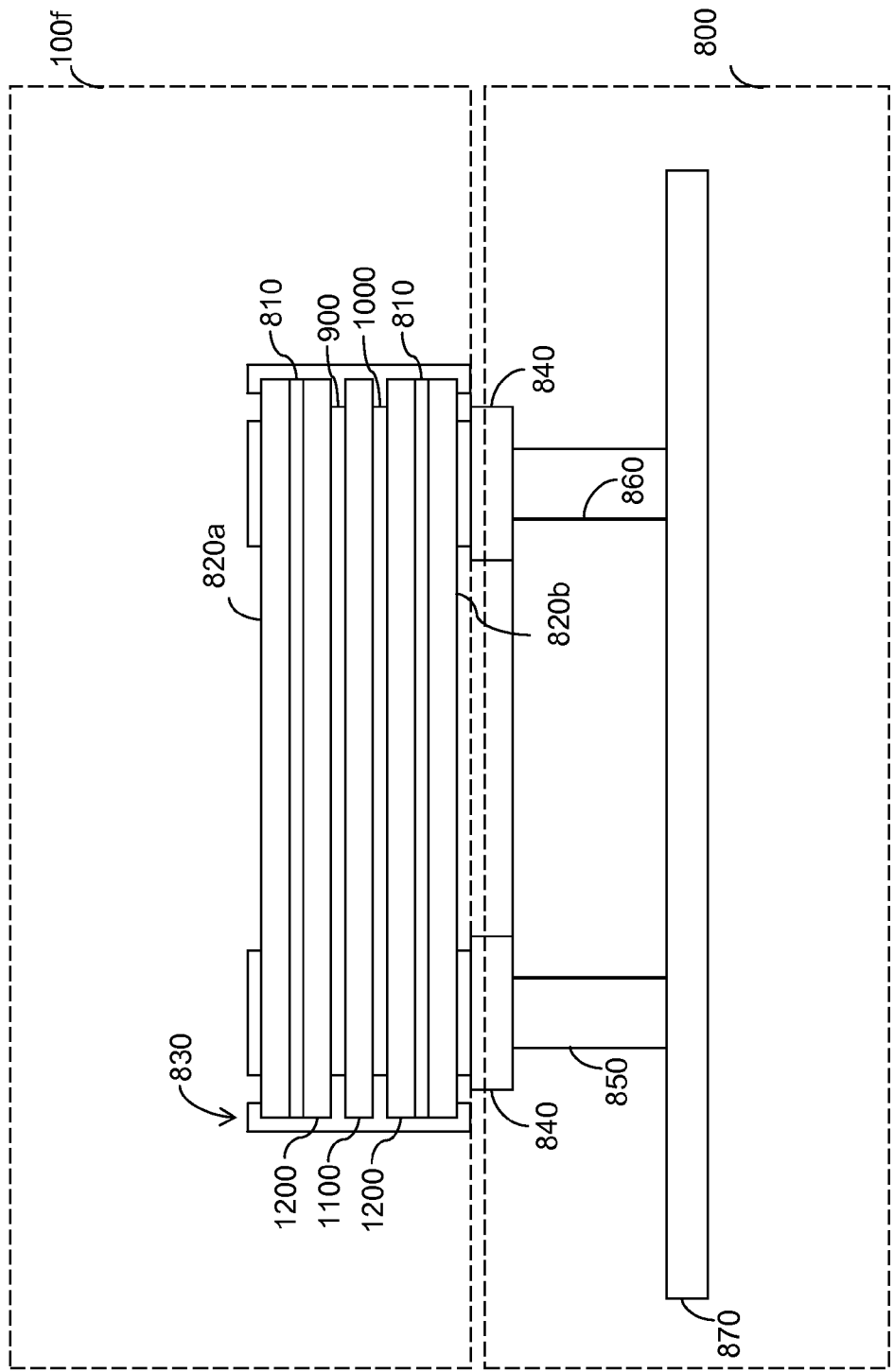
FIG. 8 is a side view of an integrated circuit mounted on a circuit board 800 in accordance with an embodiment of the invention.

FIG. 8 is a side view of the integrated circuit 100f mounted on a circuit board 800, in accordance with an embodiment of the invention.

The integrated circuit 100f is a multi-layer structure with first and second conductive layers (900, 1000) and first and second insulating layers (1100, 1200) enclosed in a box structure 810 made of a conductive material. The first and second conductive layers (900, 1000), and first and second insulating layers (1100, 1200) are discussed in subsequent figures. Ceramic layers (820a, 820b) are positioned at the top and the bottom of the box structure 810 respectively.

The box structure 810 is then mounted in a frame 830. In an embodiment, the frame 830 is metal plated. The top and bottom parts of the frame 830 provides the input and output connections. The sides of the frame 830 provide the internal ground connections such as from the capacitor terminals of the capacitors ($C_1$ and $C_2$). In another embodiment, the metal plating forms some of the ground planes for transmissions lines (stripline, microstrip, and the like). In another embodiment, the metal plating provides shielding and improved power handling capacity through improved thermal conductivity and heat sinking of the component to the system. In another embodiment, the frame 830 can be absent. In this case, the metal plating that is used to provide the input and output connections as well as the ground connection is found on the surface of the ceramic layers (820a and 820b).

It is apparent to a person having ordinary skill in the art that the metal plating can be found on the other layers. The first, second, and third conductive layers can be made using conductive materials such as copper, aluminum, or polysilicon. The first, second, and third insulating layers can be made using dielectric substrates such as ceramic.

The circuit board 800 has a metal (e.g., copper) layer 870 on the bottom which forms a ground plane. Above the copper or metal layer 870, there is a dielectric layer 860. A plurality of vias 850 are formed by drilling holes on the dielectric layer 860. The vias 850 are then copper plated inside the holes. On top of each via 850 there is a pad 840 made of copper plating on the circuit board 800. The frame 830 of the integrated circuit 100f is mounted on the pads 840.

Figure 9:
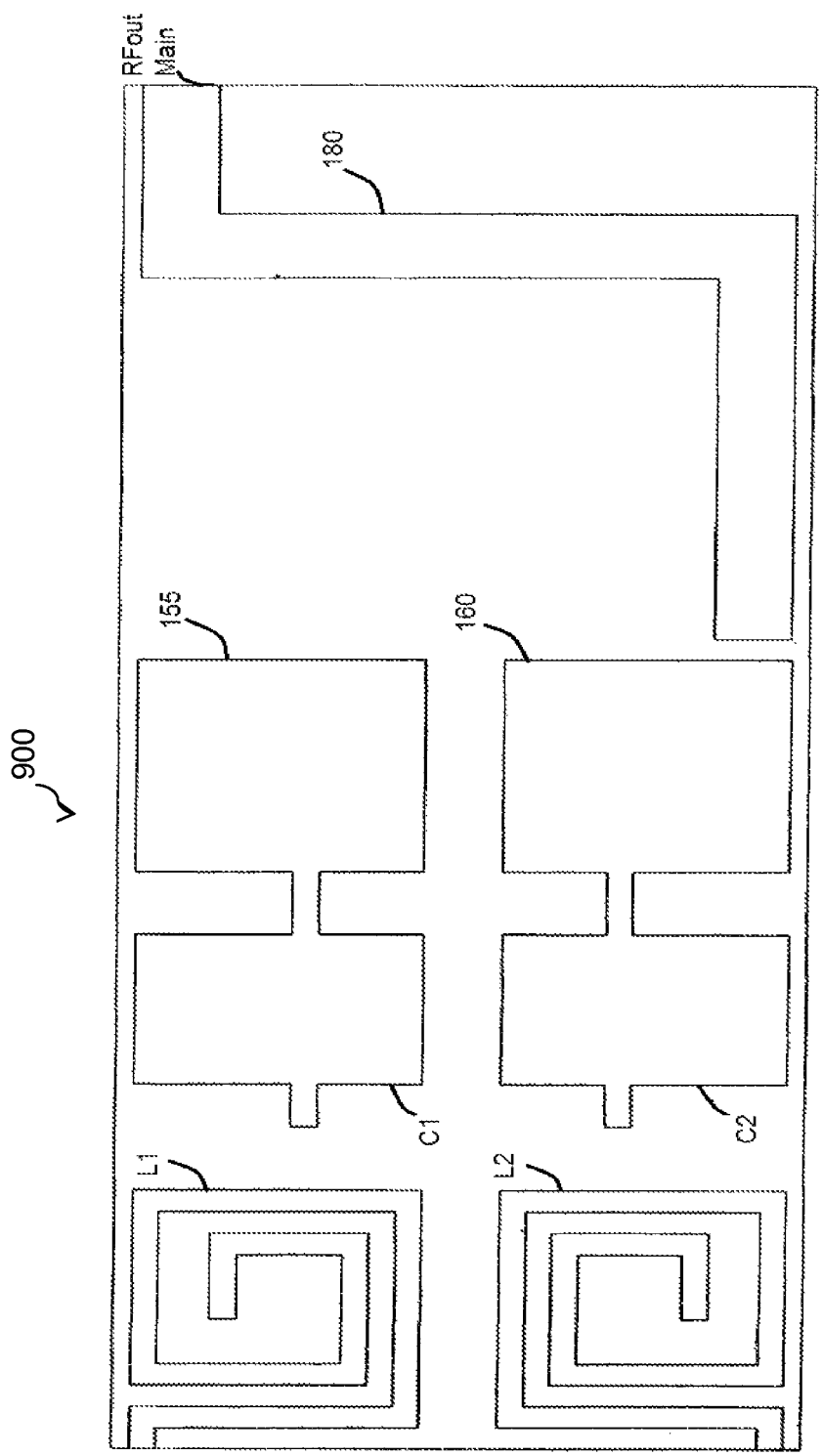
FIG. 9 illustrates a layout of a first conductive layer of the integrated circuit in accordance with an embodiment of the invention.

FIG. 9 illustrates a layout of the first conductive layer 900 of the integrated circuit (such as the integrated circuit 100f) in accordance with an embodiment of the invention. The first conductive layer 900 includes the first inductor $L_1$, the second inductor $L_2$, a first plate associated with the first terminal of the first capacitor $C_1$, a first plate of the first blocking capacitor 155, a first plate associated with the first terminal of the second capacitor $C_2$, and a first plate associated with the first terminal of the second blocking capacitor 160. The first conductive layer 900 further comprises the impedance transformer 180.

Figure 10:
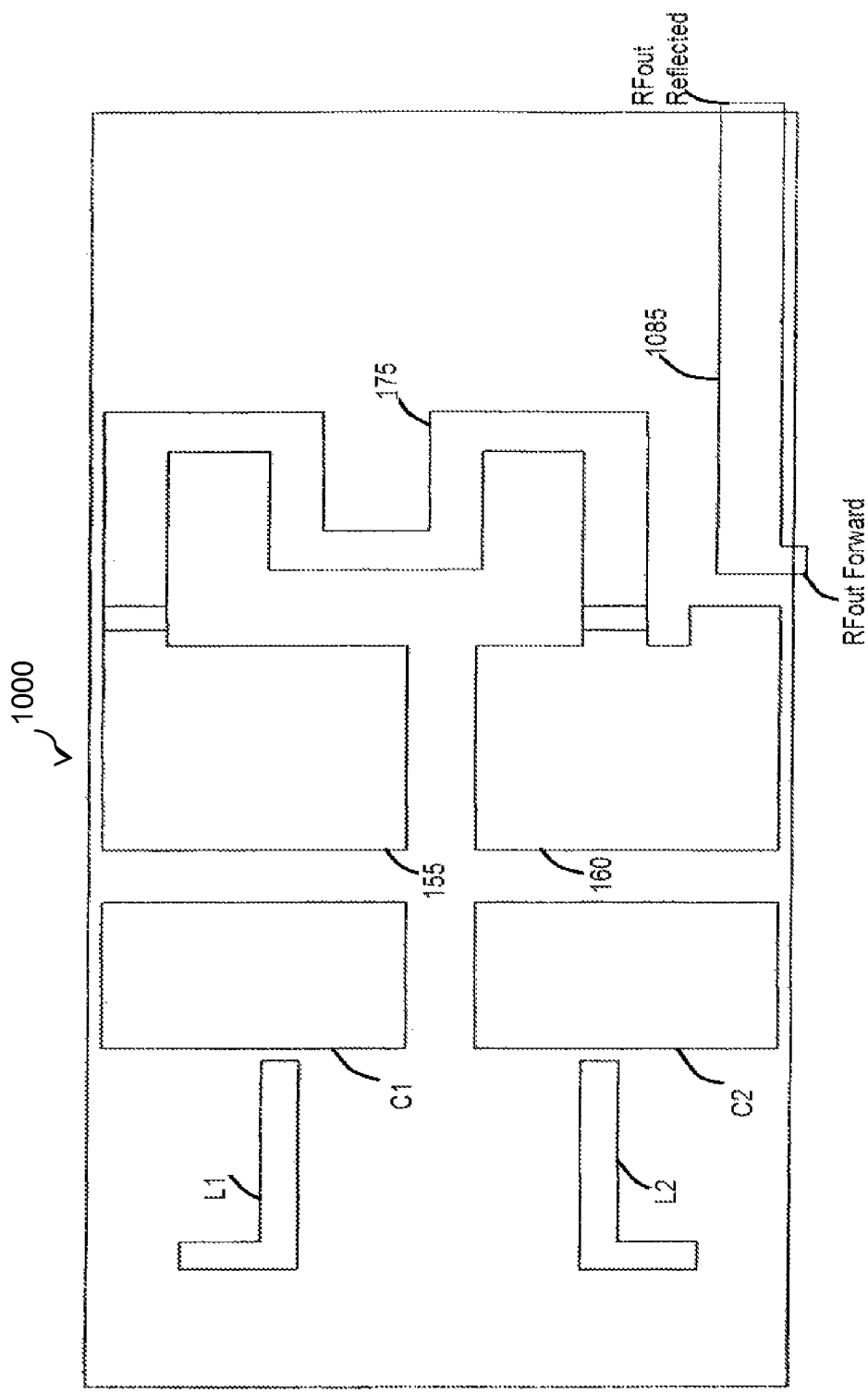
FIG. 10 illustrates a layout of a second conductive layer of the integrated circuit in accordance with an embodiment of the invention.

FIG. 10 illustrates a layout of the second conductive layer 1000 of the integrated circuit 100f in accordance with an embodiment of the invention.

The second conductive layer 1000 includes a second terminal of the first inductor $L_1$, a second terminal of the second inductor $L_2$, a second plate associated with the second terminal of the first capacitor $C_1$, a second plate associated with the second terminal of the first blocking capacitor 155, a second plate associated with the second terminal of the second capacitor $C_2$, a second plate associated with the second terminal of the second blocking capacitor 160, and the impedance inverter 175.

The first end of the impedance inverter 175 is coupled to second terminal of the first blocking capacitor 155. The second end of the impedance inverter 175 is coupled to the second terminal of second blocking capacitor 160. Also, a conductive path 1085 that provides a reflected output sample ($RF_{out\,Reflected}$), and a forward output sample ($RF_{out\,Forward}$) is provided in the second conductive layer 1000.

In an embodiment, the first and second phase shifting components (165 and 170) could be placed on the first conductive layer 900. In another embodiment, the first and second phase shifting components (165 and 170) could be placed on the second conductive layer 1000.

Figure 11:
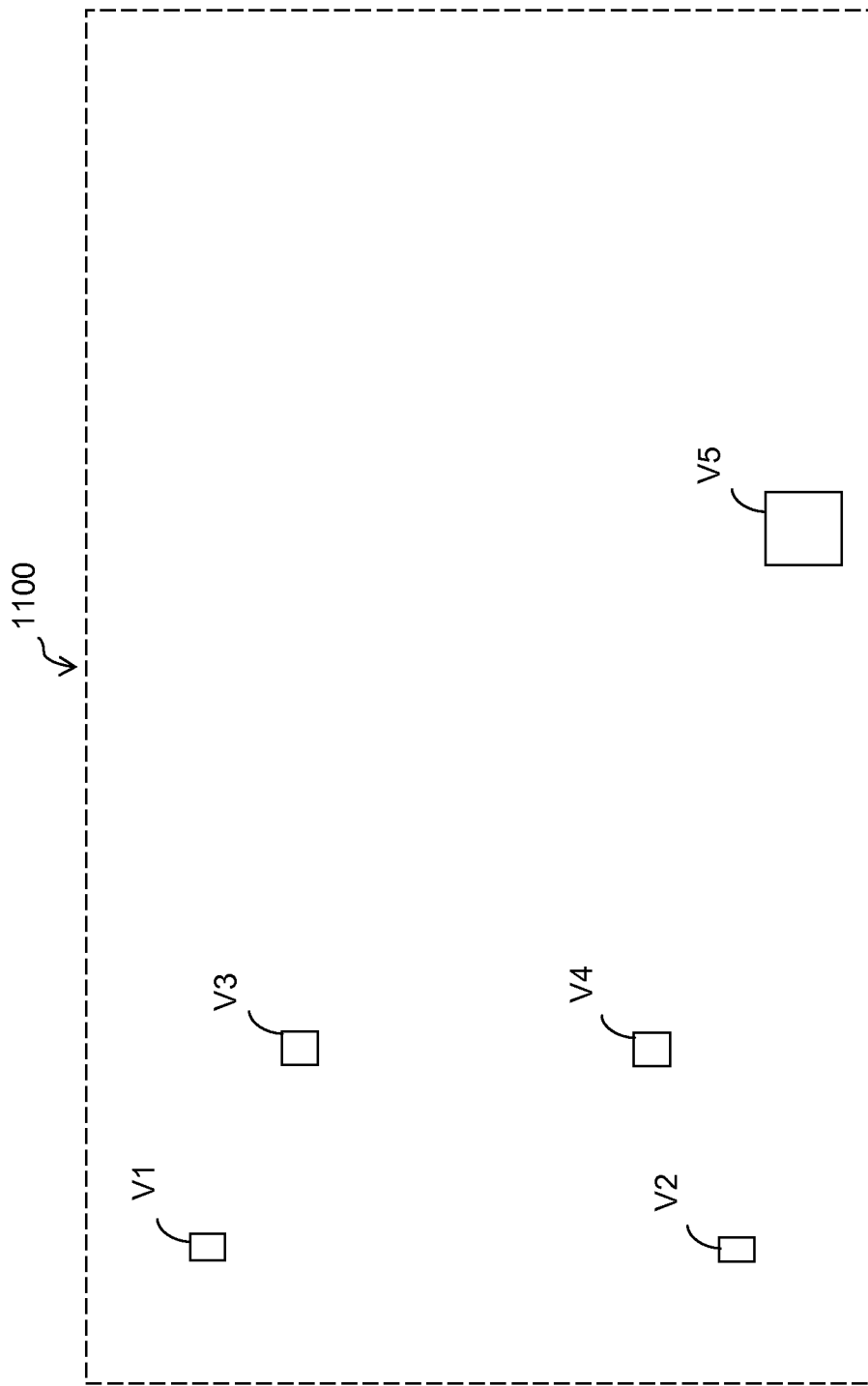
FIG. 11 illustrates a layout of a first insulating layer of the integrated circuit in accordance with an embodiment of the invention.

FIG. 11 illustrates a layout of the first insulating layer 1100 of the integrated circuit 100f in accordance with an embodiment of the invention. The first insulating layer 1100 includes a plurality of vias ($V_1, V_2, V_3, V_4$, and $V_5$). A via $V_1$ connects the first terminal to the second terminal of the first inductor $L_1$. A via $V_2$ connects the first terminal to the second terminal of the second inductor $L_2$. A via $V_3$ connects the first inductor $L_1$ to the first and second terminals of the first capacitor $C_1$, and the first terminal of the first blocking capacitor 155. A via $V_4$ connects the second inductor $L_2$ to the first and second terminals of the second capacitor $C_2$, and the first terminal of the second blocking capacitor 160. A via $V_5$ connects the second terminal of the second blocking capacitor 160 to the impedance transformer 180. The vias ($V_1, V_2, V_3, V_4$, and $V_5$) depicted with square cross-section is only an illustration and other shapes may be used as well. The vias ($V_1, V_2, V_3, V_4$, and $V_5$) are filled with the conductive material such as silver to make electrical connection between the two terminals of the two inductors.

Figure 12:
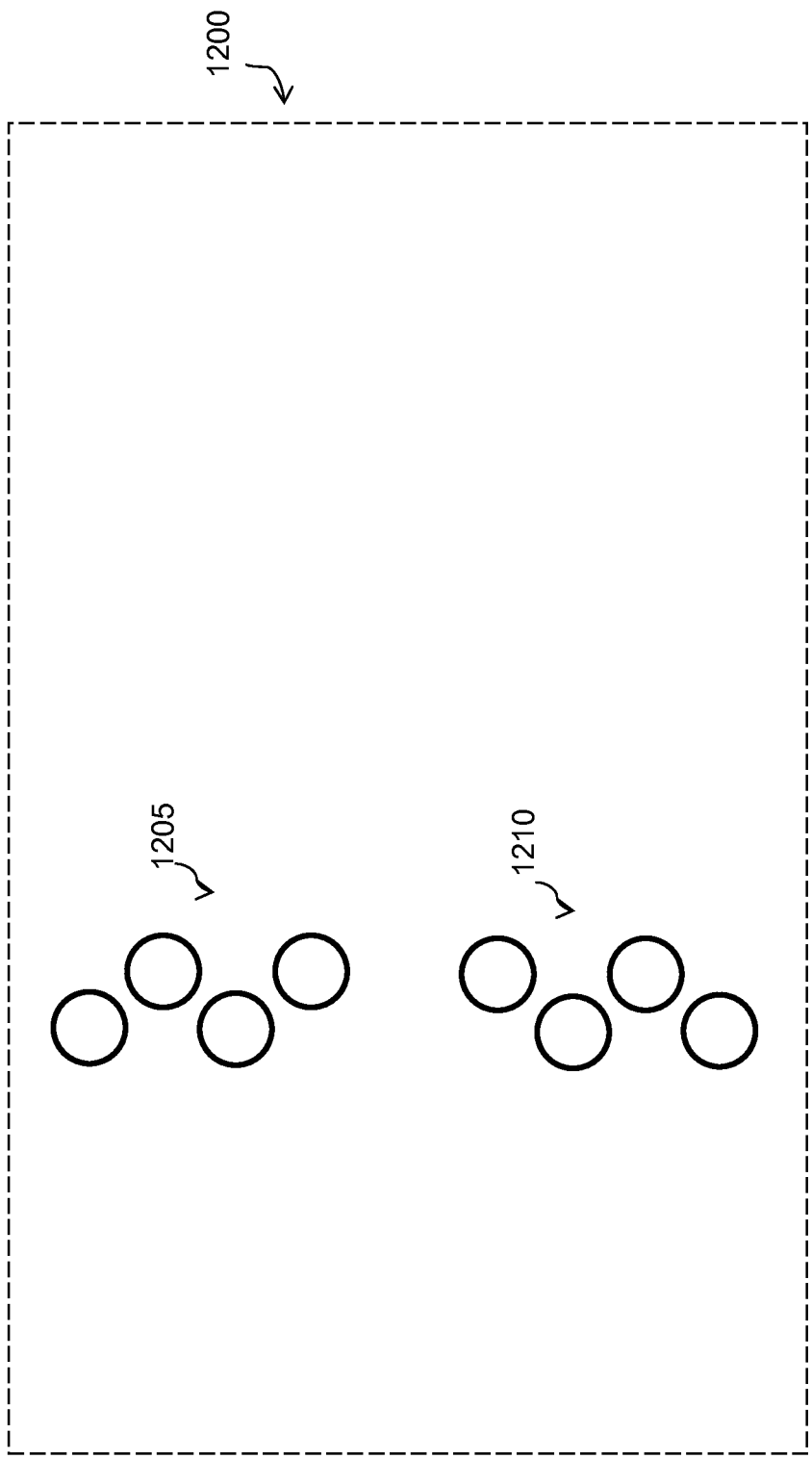
FIG. 12 illustrates a layout of a second insulating layer of the integrated circuit in accordance with an embodiment of the invention.

FIG. 12 illustrates a layout of the second insulating layer 1200 of the integrated circuit 100a in accordance with an embodiment of the invention. The second insulating layer 1200 includes vias (1205, 1210) to provide ground connections for second terminals of first capacitor $C_1$ and second capacitor $C_2$ respectively. The round cross-sections that are depicted in FIG. 12 are only illustrative and vias (1205, 1210) with other cross-sections may be used. The vias (1205, 1210) are filled with a conductive material such as silver to provide connections to the capacitor terminals.

Figure 13:
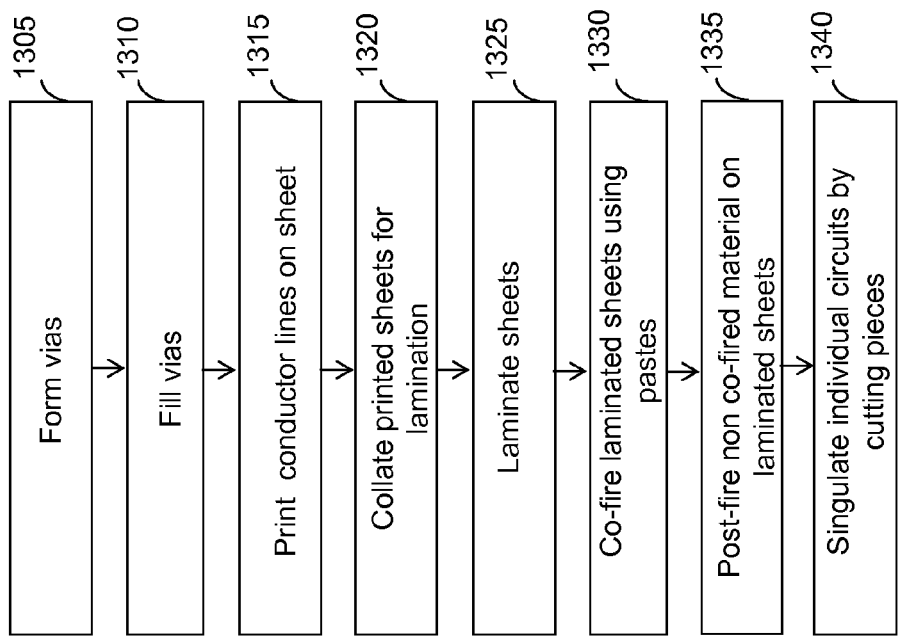
FIG. 13 is a flowchart illustrating a process for fabricating an integrated circuit in accordance with an embodiment of the invention.

FIG. 13 is a flowchart illustrating a process for fabricating the integrated circuit (such as, the integrated circuits 100a-100f) in accordance with an embodiment of the invention. The starting material is a low temperature co-fired ceramic (LTCC) ceramic substrate typically measuring about 4 inches wide; however, other sizes of ceramic substrate may also be used in the practice of the invention. Low temperature co-fired ceramic (LTCC) can be also used to form a substrate. Using the LTCC material, multiple identical individual circuits are formed simultaneously on the ceramic substrate. The FIG. 13 shows the formation of one such integrated circuit 100a, but it will be understood that the same steps are being performed simultaneously on all the circuits being made on the ceramic substrate. The formation of ceramic substrate using LTCC that is known in the art is advantageous as it has a firing temperature of about 850° C. and can use low resistive material pastes such as silver and gold for resistive or dielectric layers. The LTCC technology is used to produce multi-layer circuit with the help of a conductive, a dielectric, and/or a resistive paste.

At step 1305, an unfired tape (e.g., Green Tape™) known in the art is cut with a razor, laser or a punch to form a plurality of sheets. The first and second dielectric layers (1100, 1200) are first formed in the sheets to provide the ground connections as discussed in FIG. 11 and FIG. 12. In an embodiment, the various vias on the first and second dielectric layers (1100, 1200) can be punched or drilled using a laser or any other suitable technique. At step 1310, the vias are filled with conventional thick film screen printer or an extrusion via filler. At step 1315, the plurality of sheets are printed by applying a plurality of co-fireable conductor pastes (hereinafter, referred to as pastes) to form conductor lines using a conventional thick film screen printer. In an embodiment, a standard screen printer of 250-325 emulsion type can be used to print the sheet to form the conductive layers (900, 1000). After printing, the vias and the conductors are dried at 80 to 120° C. for 5 to 30 minutes in an oven. In order to avoid shrinkage of the sheets the pastes need to be leveled at room temperature for a few minutes before drying. The sheets can also be printed using standard thick film pastes, however printing of the co-fireable conductors using conventional thick film tends to be easier and of higher resolution than standard thick film on alumina.

At step 1320, the sheets that are printed are collated and arranged in turns one on top of the other over tooling pins for performing lamination. A heat plier can be used to fix the sheets in turns one on top of the other. At step 1325, the sheets are laminated using a uniaxial lamination or an isostatic press method. It is also possible to laminate the sheets using other forms of isostatic press method. At step 1330, the laminated sheet of the conductive layers (900, 1000) is then co-fired. At step 1335, non-fired material on the laminated sheets is post-fired. Some resistive material needs to be post-fired in order to avoid shrinkage. Here, the resistive paste is to be applied to the sheets after firing the tape and has to be fired again. The post-firing conditions depend on the used material and vary in a wide range. It is also possible to use other types of pastes such as ferrite pastes and high-k pastes, which offer a great range of possibilities to process the sheets. At step 1340, after co-firing and post-firing, the laminated sheets at the end of the formation process is scribed, cut into desirable pieces or shapes and the integrated circuit 100a is singulated. In an embodiment, each integrated circuit 100a thus formed is rectangular and measure approximately 0.6 to 1.8 mm. in a first dimension and 1.8 to 2.4 mm. in a second dimension.

It is apparent to a person having ordinary skill in the art that other suitable ceramic materials can also be used to form the substrate. This includes aluminum oxide (Alumina), aluminum nitride (ALN), beryllium oxide (BeO), CVD diamond, or epoxy-glass laminates such as FR-4 or G-10. The physical size of the device may vary widely depending on the processes used in its fabrication as well as intended power levels and frequency bands of operation. Other circuit elements may be used in addition to, or in place of those depicted. For example, the power sampling coupler 140 may be a separate dual directional coupler structure formed downstream of the impedance transformer 180. In addition, alternative implementations can use only distributed components, a combination of distributed and lumped components or only lumped components. Further, it will be readily apparent to a person having ordinary skill in the art that the invention can be implemented alternatively for n-way Doherty configuration, asymmetrical Doherty applications, inverted Doherty applications, and other derivatives and related configurations.

The embodiments of the invention provide several advantages. The integrated circuits (100a-100f) reduce size, level of integration and weight of the power amplifier systems. The integrated circuits help obtain the power amplifier systems with fewer separate components, assembly steps and reduced materials/components thereby reducing the costs. The integrated circuits are easier to use on power amplifier systems.

While various embodiments have been illustrated and described, it will be clear that the invention is not limited to these embodiments only. For a person having ordinary skill in the art it will be apparent that numerous modifications, changes, variations, substitutions and equivalents can be used without departing from the scope and spirit of the invention, as described in the claims that follow.

What is claimed is:

1. An output combiner circuit for electronic amplifiers comprising:
   a first circuit coupled to output of a first amplifier, wherein the first circuit comprises a first matching section and an impedance inverter;
   a second circuit coupled to output of a second amplifier, wherein the second circuit comprises a second matching section; and a power sampling coupler coupled to the first circuit and the second circuit, wherein the first circuit, the second circuit, and the power sampling coupler are fabricated as a single integrated circuit, and wherein the first circuit further comprises a first blocking capacitor coupled to the impedance inverter.

2. The output combiner circuit for electronic amplifiers according to claim 1, further comprising a coupler for receiving an input signal, wherein outputs of the coupler are connected to a first input matching section and a second input matching section, wherein output of the first input matching section is connected to input of the first amplifier and output of the second input matching section is connected to input of the second amplifier.

3. The output combiner circuit for electronic amplifiers according to claim 2, wherein the coupler comprises an in-phase output and a phase shifted output.

4. The output combiner circuit for electronic amplifiers according to claim 1, wherein the first circuit and the second circuit are fabricated on one or more layers in the single integrated circuit.

5. The output combiner circuit for electronic amplifiers according to claim 1, wherein the second circuit further comprises a second blocking capacitor and an impedance transformer.

6. The output combiner circuit for electronic amplifiers according to claim 1, wherein the first matching section comprises a first inductor and a first capacitor forming a first filter.

7. The output combiner circuit for electronic amplifiers according to claim 1, wherein the second matching section comprises a second inductor and a second capacitor forming a second filter.

8. The output combiner circuit for electronic amplifiers according to claim 1, wherein output signal of the first matching section is phase offset using a first phase shifting component and output signal of the second matching section is phase offset using a second phase shifting component.

9. The output combiner circuit for electronic amplifiers according to claim 1, wherein the first amplifier and the second amplifier are arranged in a Doherty type configuration.

10. The output combiner circuit for electronic amplifiers according to claim 1, wherein the power sampling coupler provides an RF output, a reflected output sample, and a forward output sample.

11. An integrated circuit comprising:
a first circuit coupled to an output of a first amplifier, wherein the first circuit comprises a first matching section, a first blocking capacitor, an impedance inverter, and a first phase shifting component;
a second circuit coupled to an output of a second amplifier, wherein the second circuit comprises a second matching section, a second blocking capacitor, an impedance transformer, and a second phase shifting component; and
a power sampling coupler coupled to the first circuit and the second circuit, wherein the first circuit, the second circuit, and the power sampling coupler are fabricated on one or more layers, and wherein the one or more layers are made of conductive material.

12. The integrated circuit according to claim 11, wherein the first matching section comprises a first inductor and a first capacitor.

13. The integrated circuit according to claim 11, wherein the second matching section comprises a second inductor and a second capacitor.

14. A multi layered integrated circuit forming an output combiner for electronic amplifiers, the multi layered integrated circuit comprising:
a first conductive layer comprising a first portion of a first matching section, a first portion of a second matching section, a first plate of a first blocking capacitor, and a first plate of a second blocking capacitor;
a second conductive layer comprising a second portion of a first matching section, a second portion of a second matching section, a second plate of a first blocking capacitor, a second plate of a second blocking capacitor, and an impedance inverter;
a first insulating layer comprising one or more first vias for facilitating one or more connections between the first conductive layer and the second conductive layer; and
a second insulating layer comprising one or more second vias for providing ground connections to the first matching section, the second matching section, the first blocking capacitor, and the second blocking capacitor.

15. The multi layered integrated circuit according to claim 14, wherein the first portion of the first matching section comprises a first portion of a first inductor, a first plate of a first capacitor; and wherein the second portion of the first matching section comprises a second portion of a first inductor, and a second plate of a first capacitor.

16. The multi layered integrated circuit according to claim 14, wherein the first portion of the second matching section comprises a first portion of a second inductor, a first plate of a second capacitor; and wherein the second portion of the second matching section comprises a second portion of a second inductor, and a second plate of a second capacitor.

17. The multi layered integrated circuit according to claim 14, wherein the first conductive layer further comprising at least one of a first phase shifting component and a second phase shifting component.

18. The multi layered integrated circuit according to claim 14, wherein the second conductive layer further comprising at least one of a first phase shifting component and a second phase shifting component.

* * * * *